United States Patent [19]

Shaffer et al.

[11] Patent Number: 4,655,516

[45] Date of Patent: Apr. 7, 1987

[54] CHIP CARRIER CONNECTOR AND METHOD OF MAKING SAME

[75] Inventors: David T. Shaffer; Philip J. Walker, both of Harrisburg, Pa.

[73] Assignee: AMP Incorporated, Harrisburg, Pa.

[21] Appl. No.: 683,896

[22] Filed: Dec. 20, 1984

[51] Int. Cl.⁴ ............................................. H05K 1/00
[52] U.S. Cl. ................................. 339/17 CF; 339/65; 339/218 M
[58] Field of Search ........... 339/218 M, 17 CF, 17 N, 339/17 C, 65, 176 MP, 125, 66; 174/52 FP; 29/482, 485, 883, 884

[56] References Cited

U.S. PATENT DOCUMENTS

| | | | |
|---|---|---|---|
| 3,512,116 | 5/1970 | Miwa et al. | 339/66 T |
| 3,545,606 | 12/1970 | Bennet | 29/842 |
| 3,622,950 | 11/1971 | Millinger | 339/17 CF |
| 3,997,227 | 12/1976 | Cutshaw | 339/17 CF |
| 4,422,708 | 12/1983 | Birnholz | 339/66 T |
| 4,530,552 | 7/1985 | Meehan et al. | 339/17 CF |

OTHER PUBLICATIONS

"Contact Insertion Method", IBM Tech. Disclosure Bulletin, vol. 22, No. 4, Sep. 1979, pp. 1508-1509.

Primary Examiner—Eugene F. Desmond
Assistant Examiner—David Pirlot
Attorney, Agent, or Firm—Adrian J. LaRue; Anton P. Ness

[57] ABSTRACT

An electrical connector in the form of a chip carrier connector comprises a dielectric frame having electrical terminal posts secured therein, top sections of the terminal posts extending above a top surface of the frame and bottom sections of the terminal posts extending outwardly from a bottom surface of the frame for insertion into respective holes in a printed circuit board, a film of dielectric material initially disposed adjacent the bottom surface of the frame and having the bottom sections of the terminal posts extending therethrough. The dielectric film is movable along the bottom sections to a position adjacent the ends of the bottom sections thereby aligning the ends of the bottom sections with the respective holes in the printed circuit board so that the bottom sections can be inserted into the respective holes.

9 Claims, 6 Drawing Figures

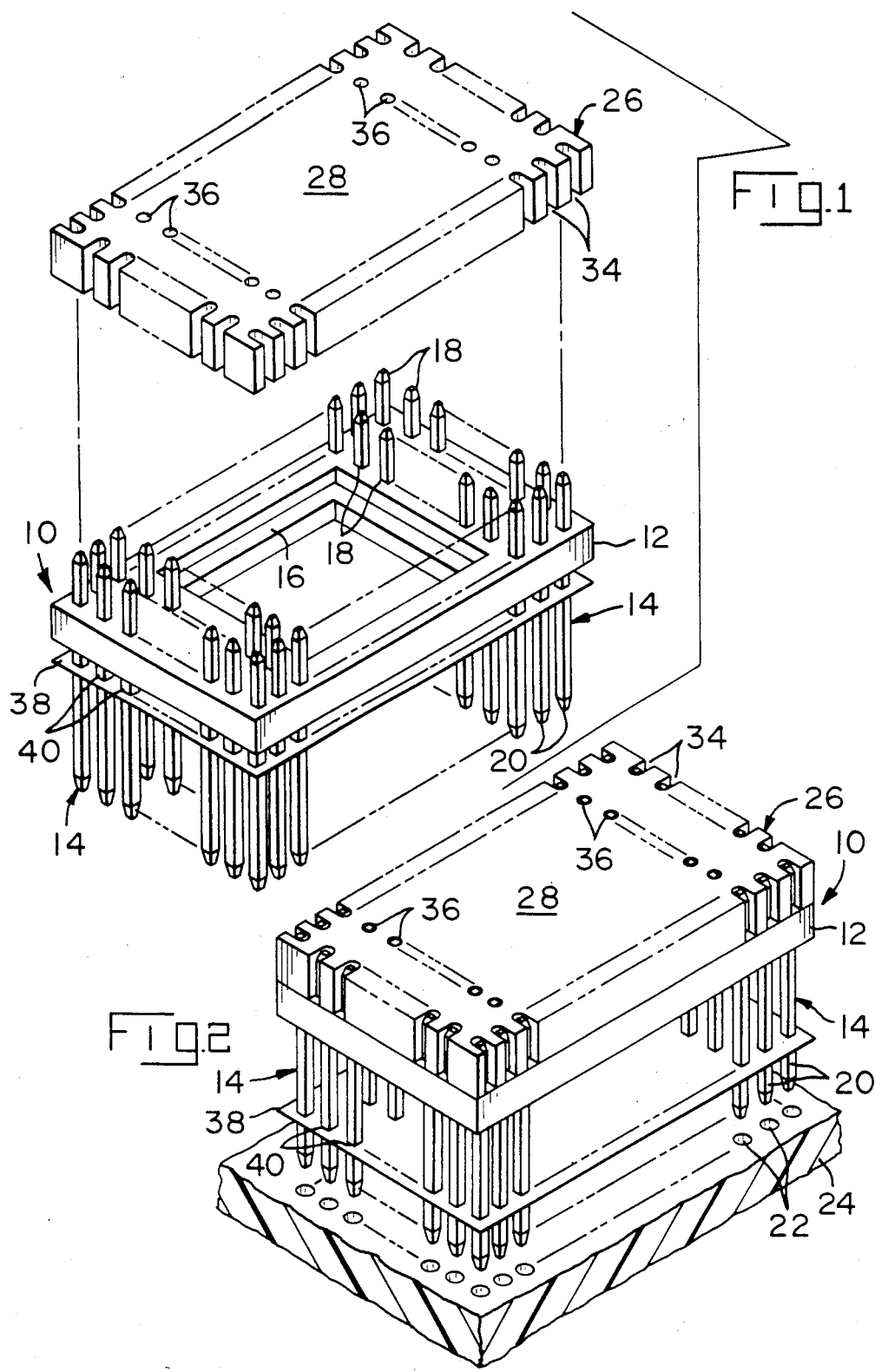

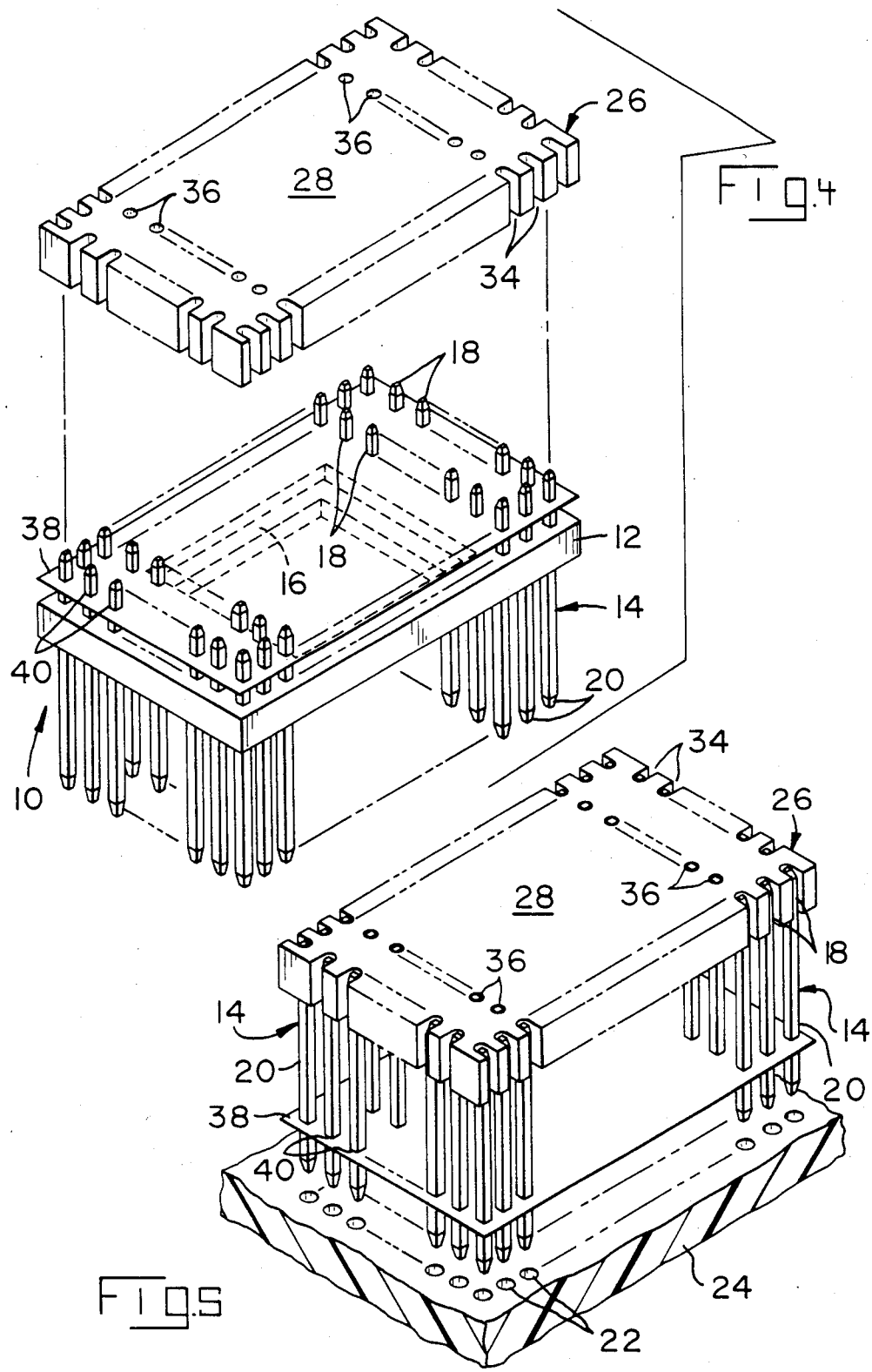

CHIP CARRIER CONNECTOR AND METHOD OF MAKING SAME

FIELD OF THE INVENTION

This invention relates to electrical connectors and more particularly to an electrical connector in the form of a chip carrier connector, and a method of aligning the bottom sections of electrical terminal posts of the chip carrier connector with respective holes in a printed circuit board for insertion thereinto.

BACKGROUND OF THE INVENTION

Ceramic chip carriers have conductive pads on one surface that extend around the edges of the chip carrier and as conductive coating into respective grooves in the sides thereof. An integrated circuit chip or die is bonded onto a central cavity area of the ceramic chip carrier and very small diameter wires are connected between the pads of the chip and the chip carrier. Top ends of electrical terminal posts in a dielectric frame of a chip carrier connector are soldered to the conductive coatings in the respective side grooves forming a terminated chip carrier package. The bottom ends of the terminal posts are then inserted into respective holes in a printed circuit board and flow soldered to conductive paths on the printed circuit board thereby electrically connecting the conductive paths to the terminal posts. The terminal posts are large in number, are in a square or rectangular pattern, and are spaced very closely together. The bottom ends of the terminal posts are typically misaligned with the respective holes which makes it difficult to insert them into the holes because of their large number, close spacing, lengths, and other factors that cause them to be out of alignment.

SUMMARY OF THE INVENTION

According to the present invention, an electrical connector in the form of a chip carrier connector comprises a dielectric frame having electrical terminal posts secured therein, top sections of the terminal posts extending above a top surface of the frame and bottom sections of the terminal posts extending outwardly from a bottom surface of the frame for insertion into respective holes in a printed circuit board. A film of dielectric material is initially disposed adjacent the bottom surface of the frame and the bottom sections of the terminal posts extend therethrough. The dielectric film is movable along the bottom sections to a position adjacent the ends of the bottom sections thereby aligning the ends of the bottom sections with the respective holes in the printed circuit board so that the bottom sections can be inserted into the respective holes. Alternatively the film is disposed adjacent the top surface of the frame, with the chip carrier thereabove, and the frame is removable from the bottom sections prior to the film being moved along the bottom sections to align their ends for insertion into the board holes. The method involves the aligning member, whether it be the frame or the film, being secured to the posts prior to the posts being secured to the chip carrier.

BRIEF DESCRIPTION OF THE DRAWINGS

FIG. 1 is a perspective view of a chip carrier connector with a ceramic chip carrier exploded therefrom.

FIG. 2 is a perspective view of the chip carrier connector, the chip carrier electrically connected to the terminal posts thereof forming a chip carrier connector package and a dielectric film disposed adjacent to the ends of the terminal posts aligning them with respective holes in a printed circuit board.

FIGS. 4 and 5 are views similar to FIGS. 1 and 2 of an alternative embodiment of the present invention.

DETAILED DESCRIPTION OF THE INVENTION

Figure 3:
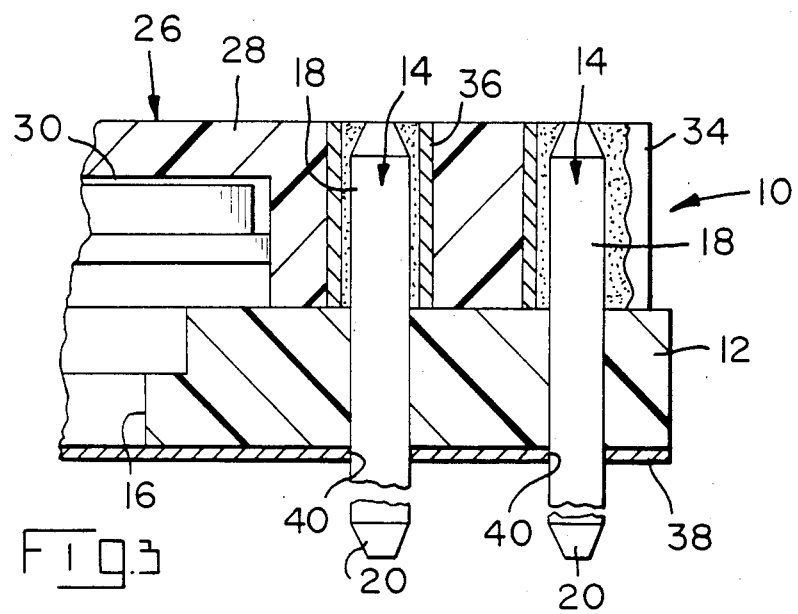
FIG. 3 is a cross-sectional view of the chip carrier connector of FIG. 2 prior to moving the dielectric film to its lowered position along the terminal posts.

FIG. 1 illustrates a chip carrier connector 10 which includes a rectangular dielectric film 12 in which electrical terminal posts 14 are secured along the sides and ends thereof as well as adjacent opposing sides of opening 16 in frame 12. These posts or pins may be round, square or any desired cross-section. Terminal posts 14 are very closely spaced together and include upper sections 18 that extend outwardly from an upper surface of frame 12 and bottom sections 20 that extend outwardly from a bottom surface of frame 12. Upper sections 18 are quite shorter than bottom sections 20 which are to be inserted into respective holes 22 in printed circuit board 24 and are flow soldered to conductive paths on printed circuit board 24. Holes 22 can be conventional plated-through holes or nonplated-through holes as the case may be.

Ceramic chip carrier 26 comprises a ceramic member 28 which has a cavity 30 therein as shown in FIG. 3. An integrated circuit chip 32 is secured in cavity 30 and is electrically connected to respective circuit paths within cavity 30; certain circuit paths extend along grooves 34 in the sides of chip carrier 26, and other paths extend to plated-through holes 36 which are located inwardly from the respective ends of ceramic member 28.

Upper sections 18 of terminal posts 14 can be coated with reflow solder so that when chip carrier 26 is placed onto frame 12 of connector 10, with chip 32 in alignment with opening 16 of frame 12 upper sections 18 are disposed in respective grooves 34 and holes 36 and upper sections 18 of posts 14 can be reflow soldered to the conductive paths associated therewith. Bottom sections 20 of posts 14 would be disposed in respective holes 22 in printed circuit board 24 and also reflow soldered to respective circuit paths thereon in accordance with conventional practices.

A dielectric film or substrate of KAPTON or MYLAR material trademarks of E.I. duPont de Nemours & Co. is disposed adjacent to the bottom surface of dielectric frame 12 with bottom sections 12 of posts 14 extending through holes 40 therein. After ceramic chip carrier 26 has been soldered to upper sections 18 of posts 14 to form a chip carrier connector package as shown in FIG. 2, dielectric film 38 is moved along bottom sections 20 of posts 14 to a position adjacent the ends thereof, as shown in FIG. 2, which aligns the bottom sections 20 with respective holes 22 in board 24 enabling the chip carrier connector package to be inserted into holes 22 in board 24 thereby precluding misalignment problem that occurs as a result of bottom sections 20 not being accurately aligned with respective holes 22. As bottom sections 20 are inserted into respective holes 22 in board 24, dielectric film 38 is moved into engagement with the bottom surface of frame 12 and remains a part of the chip carrier connector package after the posts 14 have been soldered to respective conductive paths on board 24.

FIGS. 4 and 5 illustrate an alternative embodiment of the present invention whereby dielectric film 38 is disposed adjacent the upper surface of dielectric frame 12 and is positioned between ceramic chip carrier 26 and frame 12 when upper sections 18 of posts 14 are flow soldered to respective grooves 34 and holes 36 of ceramic member 38 thereby forming a chip carrier connector package as shown in FIG. 2. Frame 12 is the removed from the package by moving frame 12 along bottom sections 20 of posts 14 whereafter dielectric film 38 is also moved along bottom sections 30 of posts 14 to a position adjacent the ends thereof as shown in FIG. 5 thereby accurately aligning bottom sections 20 with respective holes 22 in board 24 enabling bottom sections 20 to be inserted within respective holes 22. Dielectric film 38 is disposed between ceramic chip carrier 26 and board 24 when the chip carrier connector package is positioned onto board 24 with posts 14 soldered in electrical engagement with respective conductive paths on board 24. The embodiment of FIGS. 4 and 5 is important when space requirements necessitate reducing the distance between board 24 and carrier 26 closely stacked printed circuit boards.

In order to make chip carrier connector 10 as shown in FIGS. 1 and 4, posts 14 are arranged into an array parallel to and spaced from each other to coincide with the pattern of holes 22 in board 24, and are punched through film 38 and located in a conventional mold. Thereafter, frame 12 in the form of a dielectric material having suitable dielectric characteristics is molded onto posts 14 and connector 10 is removed from the mold for receiving ceramic chip carrier 26 thereon. Dielectric film 38 can be a continuous strip forming a continuous strip of chip carrier connectors to which respective ceramic chip carriers 26 are soldered forming chip carrier connector packages for mounting onto printed circuit boards as heretofore described.

In the case of the embodiment of FIGS. 4 and 5, dielectric film 38 is applied onto upper sections 18 of posts 14 after frame 12 has been molded thereto, or assembled to the array of posts 14 before molding as in FIGS. 1 and 2 and is adjacent the bottom surface of frame 12 after molding thereof.

Figure 6:
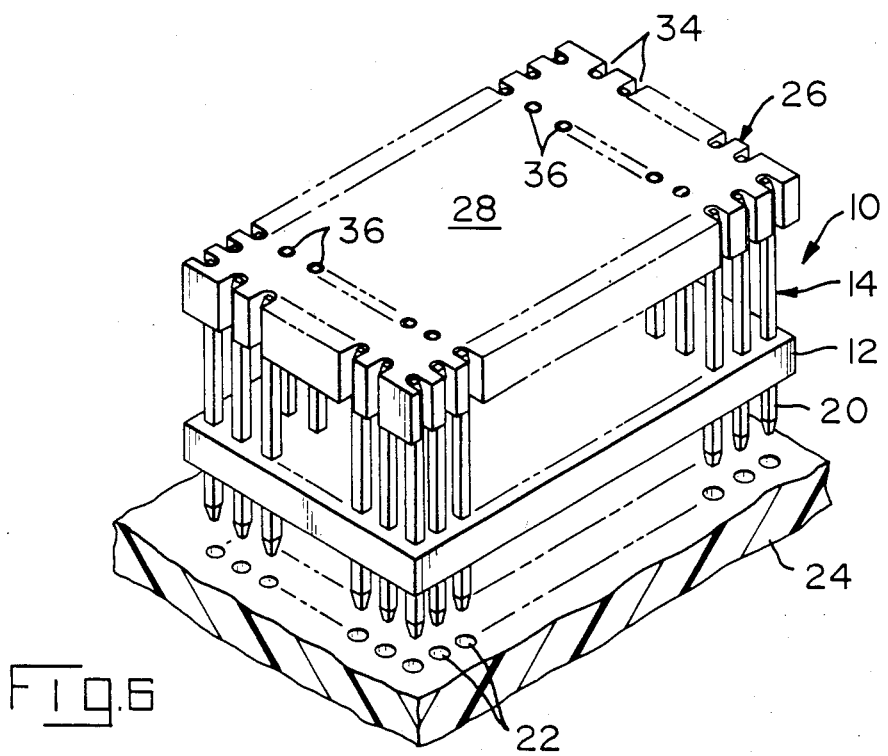
FIG. 6 is a view similar to FIG. 2 of a further embodiment of the present invention.

In the embodiment of FIG. 6, frame 12 is moved along bottom sections 20 of terminal posts 14 and positioned adjacent to the ends thereof thereby aligning posts 14 with respective holes 22 of board 24 which enables posts 14 to be inserted into holes 22. Frame 12 is then moved along bottom sections 20 and positioned between chip carrier 26 and board 24 when in a final position thereon with posts 14 flow soldered to respective conductive paths on board 24. Thus, no dielectric film is used in this embodiment. The frame is moved along the posts by holding the chip carrier and grasping the frame along the upper surface by grasping members and sliding the frame to its designated position. The same position is followed when removing the frame in the embodiment of FIGS. 4 and 5.

We claim:
1. A chip carrier connector, comprising:
an array of parallel spaced electrical terminal posts selectively positioned and having upper sections and bottom sections, said upper sections adapted to be electrically connected with respective conductive areas of a ceramic chip carrier, and said bottom sections to be inserted into respective holes in a printed circuit board for electrical connection with respective circuit paths thereof;
a dielectric frame molded to said terminal posts proximate said upper sections thereof;
a ceramic chip carrier having conductive areas within which said upper sections of said terminal posts are secured and electrically connected and adapted to receive a circuit chip therein and having circuit paths extending from said circuit chip to said conductive areas; and
said connector including a dielectric aligning means comprising a dielectric flexible substrate containing no preformed apertures forced over said terminal posts between said upper sections and bottom sections thereof prior to said securing of said chip carrier to said terminal posts, said dielectric aligning means adapted to be movable along said bottom sections of said terminal posts to a position adjacent the ends thereof to align said bottom sections with said respective holes in said printed circuit board for insertion thereinto.

2. A chip carrier connector as set forth in claim 1 wherein said substrate is placed over said sections of said terminal posts and adjacent the upper surface of said dielectric frame before said chip carrier is secured to said upper sections, whereby said dielectric frame can be removed from said connector along said bottom sections of said terminal posts prior to insertion of said terminal posts into said respective holes of said printed circuit board to reduce the distance between said printed circuit board and said chip carrier.

3. A chip carrier connector as set forth in claim 1 wherein said array of terminal posts are punched into said substrate prior to molding said dielectric frame to said upper sections of said terminal posts, and said substrate is disposed adjacent a bottom surface of said dielectric frame.

4. A method of making an electronic component package having an array of parallel spaced electrical terminal posts with bottom sections alignable for insertion into respective holes of a printed circuit board without pre-insertion into holes of an alignment device, comprising the steps of:
arranging an array of electrical terminal posts in a selected arrangement such that said posts are spaced and parallel;
molding a dielectric frame to said terminal posts proximate upper sections thereof such that after completion of said package said dielectric frame is movable along bottom sections of said terminal posts to a position adjacent the ends thereof thereby aligning said ends for insertion into respective holes in a printed circuit board; and
securing to said upper sections of said terminal posts an electronic component having circuit paths electrically connected to respective said terminal posts.

5. A method as set forth in claim 4 further comprising, after said arranging step, the step of inserting onto said array of terminal posts a dielectric flexible substrate between said upper sections and said bottom sections such that said dielectric frame is molded onto said terminal posts adjacent a surface of said dielectric flexible substrate such that after completion of said package each of a lower one and an upper one of said dielectric frame. Said dielectric flexible substrate is movable along said bottom sections of said terminal posts to a position adjacent to the ends thereof whereby a selected one of said dielectric frame and said dielectric flexible substrate when so moved aligns said ends for insertion into respective holes in a printed circuit board.

6. A method as set forth in claim 4 further comprising, after said molding step, the step of inserting onto said upper sections of said terminal posts a dielectric flexible substrate to a position adjacent the upper surface of said dielectric frame such that after completion of said package said dielectric frame is movable along said bottom sections of said terminal posts and removable therefrom, and said dielectric flexible substrate is movable along said bottom sections of said terminal posts to a position adjacent the ends thereof aligning said ends with respective holes in a printed circuit board for insertion thereinto.

7. A method as set forth in claim 5 wherein said dielectric frame is molded onto said terminal posts adjacent the upper surface of said dielectric flexible substrate such that after completion of said package said dielectric flexible substrate is movable along said bottom sections of said terminal posts to a position adjacent the ends thereof thereby aligning said ends with respective holes in a printed circuit board for insertion thereinto.

8. A method as set forth in claim 5 wherein said dielectric frame is molded onto said terminal posts adjacent the lower surface of said dielectric flexible substrate such that after completion of said package said dielectric frame is movable along said bottom sections of said terminal posts and removable therefrom, and said dielectric flexible substrate is movable along said bottom sections of said terminal posts to a position adjacent the ends thereof thereby aligning said ends with respective holes in a printed circuit board for insertion thereinto.

9. An electric component package comprising:
an array of parallel spaced electrical terminal posts selectively positioned and having upper sections and bottom sections, said upper sections adapted to be electrically connected with respective conductive areas of an electronic component, and said bottom sections to be inserted into respective holes in a printed circuit board for electrical connection with respective circuit paths thereof;
a dielectric frame molded to said terminal posts proximate said upper sections thereof defining a connector; and
an electronic component having conductive areas within which said upper sections of said terminal posts are secured and electrically connected and having circuit paths extending to said conductive area;
said dielectric frame being secured around said terminal posts between said upper sections and bottom sections thereof prior to said securing of said electronic component to said terminal posts, and said dielectric frame being adapted to be movable along said bottom sections of said terminal posts to a position adjacent the ends thereof of align said bottom sections with said respective holes in said printed circuit board for insertion thereinto.

* * * * *